(12) United States Patent
Yang et al.

(10) Patent No.: US 9,870,980 B2
(45) Date of Patent: Jan. 16, 2018

(54) SEMICONDUCTOR PACKAGE WITH THROUGH SILICON VIA INTERCONNECT

(71) Applicant: MediaTek Inc., Hsin-Chu (TW)

(72) Inventors: Ming-Tzong Yang, Baoshan Township, Hsinchu County (TW); Yu-Hua Huang, Hsinchu (TW); Wei-Che Huang, Zhudong Township, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 4 days.

(21) Appl. No.: 14/986,295

(22) Filed: Dec. 31, 2015

(65) Prior Publication Data

US 2016/0118318 A1 Apr. 28, 2016

Related U.S. Application Data

(62) Division of application No. 13/855,873, filed on Apr. 3, 2013, now Pat. No. 9,257,392.

(Continued)

(51) Int. Cl.
*H01L 23/48* (2006.01)
*H01L 23/538* (2006.01)
(Continued)

(52) U.S. Cl.
CPC ...... *H01L 23/481* (2013.01); *H01L 21/76898* (2013.01); *H01L 23/528* (2013.01);
(Continued)

(58) Field of Classification Search
CPC ............. H01L 23/481; H01L 29/42356; H01L 23/528; H01L 27/088; H01L 29/0649;
(Continued)

(56) References Cited

U.S. PATENT DOCUMENTS 6,787,913 B2 9/2004 Yamada
7,611,942 B2 11/2009 Minami et al.
(Continued)

FOREIGN PATENT DOCUMENTS

EP 1 672 688 6/2006
TW 200421592 10/2004
(Continued)

OTHER PUBLICATIONS

Mann, et al., "Silicides and local interconnections for high-performance VLSI applications", IBM J. Res. Develop., vol. 39 No. 4 Jul. 1996, pp. 403-417.*

(Continued)

*Primary Examiner* — Tom Thomas
*Assistant Examiner* — Vincent Wall
(74) *Attorney, Agent, or Firm* — McClure, Qualey & Rodack, LLP

(57) ABSTRACT

The invention provides a semiconductor package with a through silicon via (TSV) interconnect. An exemplary embodiment of the semiconductor package with a TSV interconnect includes a semiconductor substrate, having a front side and a back side. A contact array is disposed on the front side of the semiconductor substrate. An isolation structure is disposed in the semiconductor substrate, underlying the contact array. The TSV interconnect is formed through the semiconductor substrate, overlapping with the contact array and the isolation structure.

6 Claims, 4 Drawing Sheets

Related U.S. Application Data

(60) Provisional application No. 61/622,779, filed on Apr. 11, 2012.

(51) Int. Cl.
| | | |
|---|---|---|
| *H01L 21/768* | (2006.01) | |
| *H01L 23/00* | (2006.01) | |
| *H01L 23/528* | (2006.01) | |
| *H01L 27/088* | (2006.01) | |
| *H01L 29/06* | (2006.01) | |
| *H01L 29/423* | (2006.01) | |

(52) U.S. Cl.
CPC .......... *H01L 23/5384* (2013.01); *H01L 24/11* (2013.01); *H01L 27/088* (2013.01); *H01L 29/0649* (2013.01); *H01L 29/42356* (2013.01); *H01L 2224/02372* (2013.01); *H01L 2224/0912* (2013.01); *H01L 2225/06541* (2013.01)

(58) Field of Classification Search
CPC ............... H01L 21/76898; H01L 24/11; H01L 23/5384; H01L 2225/06541; H01L 2224/02372; H01L 2224/02381; H01L 2224/0912; H01L 2224/0401; H01L 2224/14104; H01L 23/535; H01L 23/5386; H01L 21/76224
See application file for complete search history.

(56) References Cited

U.S. PATENT DOCUMENTS

| | | | | |
|---|---|---|---|---|
| 7,939,449 | B2 * | 5/2011 | Cobbley | ........... H01L 21/76898 257/E21.585 |
| 8,536,705 | B2 | 9/2013 | Yelehanka et al. | |
| 2001/0005046 | A1 * | 6/2001 | Hsuan | ............... H01L 21/76898 257/686 |
| 2006/0223301 | A1 * | 10/2006 | Vanhaelemeersch | . H01L 21/762 438/618 |
| 2008/0136026 | A1 * | 6/2008 | Yang | ....................... H01L 23/29 257/738 |
| 2009/0309232 | A1 * | 12/2009 | Roy | .................. H01L 21/76898 257/774 |
| 2010/0130008 | A1 * | 5/2010 | Smith | ............... H01L 21/76898 438/667 |
| 2010/0164109 | A1 | 7/2010 | Chiou | |
| 2010/0327383 | A1 * | 12/2010 | Hayasaki | .......... H01L 21/76898 257/432 |
| 2011/0089572 | A1 * | 4/2011 | Tezcan | .............. H01L 21/76898 257/774 |
| 2012/0007154 | A1 | 1/2012 | Lin et al. | |
| 2012/0007243 | A1 | 1/2012 | Roy | |
| 2012/0061827 | A1 * | 3/2012 | Fujita | ................ H01L 21/30655 257/737 |
| 2012/0315738 | A1 * | 12/2012 | Kobayashi | ........ H01L 21/76898 438/424 |
| 2013/0026599 | A1 * | 1/2013 | Nakamura | ............... H01L 24/13 257/508 |
| 2013/0157436 | A1 * | 6/2013 | Hummler | .......... H01L 21/76898 438/424 |
| 2013/0249011 | A1 | 9/2013 | Choi | |
| 2013/0334669 | A1 | 12/2013 | Kuo | |
| 2014/0054743 | A1 * | 2/2014 | Hurwitz | .............. H01L 29/0642 257/508 |
| 2014/0264941 | A1 | 9/2014 | Law et al. | |

FOREIGN PATENT DOCUMENTS

| | | |
|---|---|---|
| TW | 201017784 | 5/2010 |
| TW | 201023323 | 6/2010 |
| TW | 201037806 | 10/2010 |
| TW | 201104796 | 2/2011 |

OTHER PUBLICATIONS

Chinese Office action for Chinese application 201310120374.2.*

* cited by examiner

US 9,870,980 B2

SEMICONDUCTOR PACKAGE WITH THROUGH SILICON VIA INTERCONNECT

CROSS REFERENCE TO RELATED APPLICATIONS

This is a divisional of U.S. application Ser. No. 13/855,873, filed on Apr. 3, 2013, which claims the benefit of U.S. Provisional Application No. 61/622,779, filed on Apr. 11, 2012. The entire contents of the related applications are incorporated herein by reference.

BACKGROUND OF THE INVENTION

Field of the Invention

The present invention relates to a semiconductor package with a through silicon via (TSV) interconnect, and in particular, to an etch-stop structure for a semiconductor package with a through silicon via (TSV) interconnect.

Description of the Related Art

In electronic engineering, a through silicon via (TSV) is a vertical electrical connection passing completely through a silicon wafer or die. A TSV is a high performance technique, when compared to alternatives such as package-on-package, used to create three-dimensional (3D) semiconductor packages and 3D integrated circuits. The density of a TSV via is substantially higher than alternatives as the length of connections thereby are shorter.

The conventional TSV technique for forming a semiconductor package comprises forming an opening through dielectric layers of an interconnect structure and/or a semiconductor substrate of the semiconductor package. A conformal liner and a barrier seed layer are formed on sidewalls and a bottom of the opening. A conductive material such as copper (Cu), fills the opening to form a TSV. Currently, several TSV opening etching processes, comprising a via last etching process and a via middle etching process, can be selected to form TSVs. The last TSV via etching process is performed from a back side of the semiconductor substrate and is required to stop at contacts of the interconnect structure. However, poor selectivity between a semiconductor substrate (Si) and dielectric layers (Oxide) of the interconnect structure will cause a rough interface and make it difficult to control the etching profile of the TSV opening. As a result, the conductive material (Cu) filled in TSV opening will diffuse outwardly to contaminate a device.

Thus, a novel etch-stop structure for a semiconductor package with a TSV interconnect is desirable.

BRIEF SUMMARY OF THE INVENTION

A semiconductor package with a through silicon via (TSV) interconnect is provided. An exemplary embodiment of a semiconductor package with a through silicon via (TSV) interconnect includes a semiconductor substrate, having a front side and a back side. A contact array is disposed on the front side of the semiconductor substrate. An isolation structure is disposed in the semiconductor substrate, underlying the contact array. The TSV interconnect is formed through the semiconductor substrate, overlapping with the contact array and the isolation structure, wherein the isolation structure comprises shallow trench isolation (STI) features, and the contact array comprises contacts, wherein the STI features avert overlapping with the contacts.

Another exemplary embodiment of a semiconductor package with a through silicon via (TSV) interconnect includes a semiconductor substrate, having a front side and a back side. A contact array is disposed on the front side of the semiconductor substrate. The TSV interconnect is formed through the semiconductor substrate, underlying the contact array. An isolation structure is disposed in the semiconductor substrate, wherein the isolation structure is located between two contacts from a top view.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
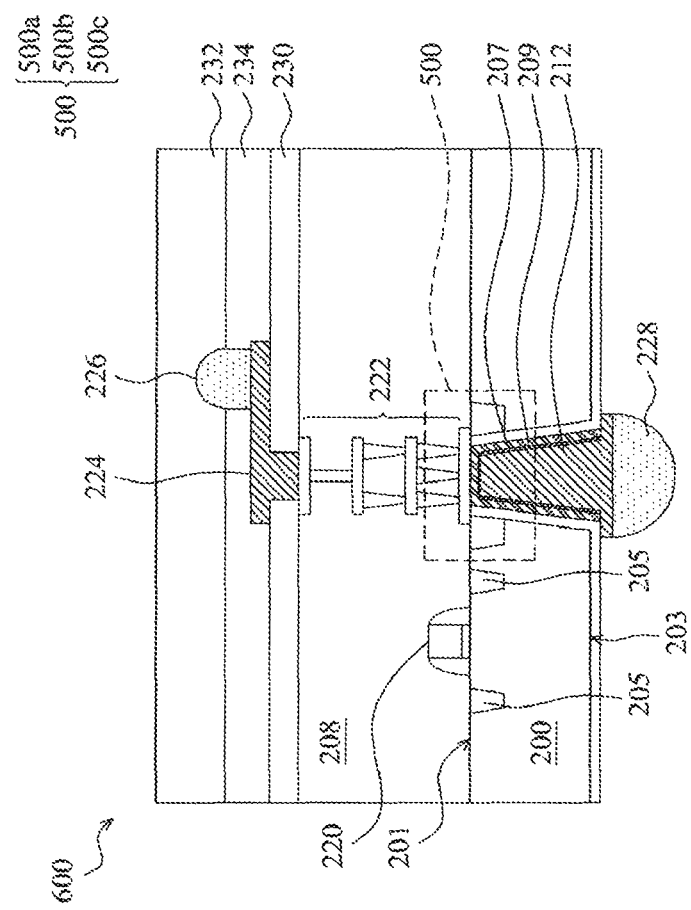
FIG. 1 is a cross section of one exemplary embodiment of a semiconductor package with a through silicon via (TSV) interconnect of the invention.

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

FIG. 1 is a cross section of one exemplary embodiment of a semiconductor package 600 with a through silicon via (TSV) interconnect 212 of the invention. In this embodiment, the semiconductor package 600 is fabricated by via last TSV technology. The TSV interconnect 212 etches from a back side 203 of a semiconductor substrate 200 and stop at contacts of an interconnect structure 222. As shown in FIG. 1, the semiconductor package 600 comprises a semiconductor substrate 200 having a front side 201 and a back side 203. In one embodiment, the semiconductor substrate 200 may comprise silicon. In alternative embodiments, an SiGe, bulk semiconductor, strained semiconductor, compound semiconductor, silicon on insulator (SOI), and other commonly used semiconductor substrates can be used for the semiconductor substrate 200. The semiconductor substrate 200 may have a desired conductive type by implanting p-type or n-type impurities therein. An integrated circuit device 220, such as a transistor, is formed on the front side 201 of the semiconductor substrate 200. As shown in FIG. 1, the integrated circuit device 220 is isolated from other devices (not shown) by shallow trench isolation (STI) features 205 formed in the semiconductor substrate 200. An interconnect structure 222 is formed on the front side 201 of the semiconductor substrate 200, in a dielectric layer laminating structure 208. In one embodiment, the interconnect structure 222 electrically connects to the integrated circuit device 220. In one embodiment, the interconnect structure 222 may be constructed by contacts, via and metal layer patterns, and the metal layer patterns are disposed vertically between the contacts and via and/or vias in different layer levels. The number of metal layer patterns is defined by design for the integrated circuit device 220 and the scope of the invention is not limited.

A first passivation layer 230 is formed covering a top of the interconnect structure 222. The redistribution pattern 224 is formed through the first passivation layer 230 by a photolithography, plating and patterning process. In this embodiment, the redistribution pattern 224 is formed of aluminum (Al). A solder mask layer 234 is disposed on the top of the interconnect structure 222, covering the redistribution pattern 224. A first conductive bump 226 is formed over the front side 201 of the semiconductor substrate 200. Also, the first conductive bump 226 is formed through the solder mask layer 234 to connect to the redistribution pattern 224 by a patterning and solder-reflow process. In one embodiment, the first conductive bump 226 may comprise a solder ball, metal pillar or combinations thereof. Also, a second passivation layer 232 is formed covering the solder mask layer 234 and the first conductive bump 226. A TSV interconnect 212 formed through the semiconductor substrate 200 is electrically connected to the interconnect structure 222. A second conductive bump 228 is formed below the back side 203 of semiconductor substrate 200 and is electrically connected to the TSV interconnect 212.

It is noted that the semiconductor package 600 comprises an etch-stop structure 500 for the TSV interconnect 212. The etch-stop structure 500 is disposed vertically between the contacts of the interconnect structure 222 and the TSV interconnect 212. The etch-stop structure 500 may provide additional features formed of materials other than the contacts of the interconnect structure 222 and the semiconductor substrate 200. Therefore, an opening of the TSV interconnect 212 may stop at the contacts of the interconnect structure 222 during the TSV etching process from the back side 203 of the semiconductor substrate 200.

Figure 2:
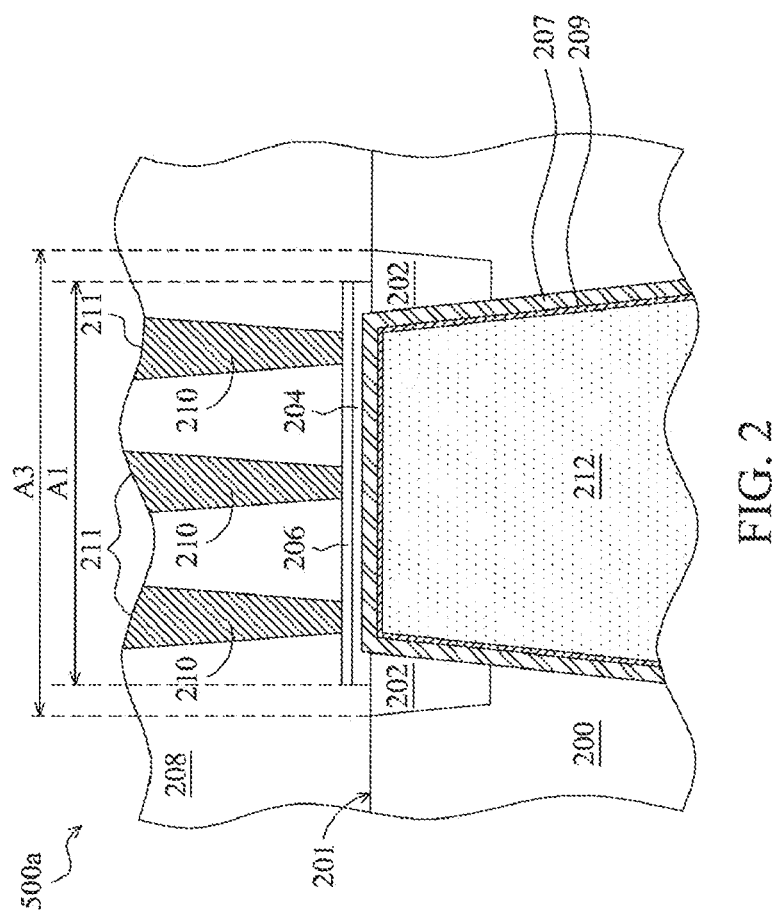
FIG. 2 is an enlarged view of one exemplary embodiment of an etch-stop structure for a semiconductor package with a through silicon via (TSV) interconnect of the invention as shown in FIG. 1.

The etch-stop structure 500 may have various arrangements. FIG. 2 is an enlarged view of one exemplary embodiment of the etch-stop structure 500 as shown in FIG. 1. In this embodiment, the etch-stop structure shown in FIG. 2 is labeled as the etch-stop structure 500a. As shown in FIG. 2, the etch-stop structure 500a is disposed directly under a contact array 211 comprising a plurality of contacts 210 disposed on the front side 201 of the semiconductor substrate 200. In this embodiment as shown in FIG. 2, the etch-stop structure 500a may comprise a single isolation structure 202, such as an STI, disposed in the semiconductor substrate 200, underlying the contact array 211. In one embodiment, the single isolation structure 202 may be formed with the STI features 205 as shown in FIG. 1, simultaneously. Also, a gate structure 204 is disposed on the front side 201 of the semiconductor substrate 200, between the contact array and the single STI feature 202. Also, the gate structure 204 is disposed directly on the single STI feature 202. In one embodiment, the gate structure 204 may be formed with a gate structure of the integrated circuit device 220 as shown in FIG. 1, simultaneously. In one embodiment, the gate structure 204 is formed of poly materials or high dielectric constant (k>10) metal materials A salicide layer 206 is formed on the gate structure 204. Therefore, the contact array 211 lands on and contacts to the salicide layer 206 after a formation process of the contact array 211.

In this embodiment as shown in FIG. 2, the TSV interconnect 212 is underlying the contact array 211, overlapping with the contact array 211 and the single isolation structure 202. A boundary A1 of the gate structure 204 surrounds the contact array 211 and the TSV interconnect 212. Also, a boundary A2 of the single isolation structure 202 surrounds the boundary A1 of the gate structure 204 and surrounds the TSV interconnect 212. During the etching process of the TSV opening of the TSV interconnect 212 directly underlying the contact array 211, the single isolation structure 202 formed of oxide has a high etch selectively to the semiconductor substrate 200, which is formed of a semiconductor material such as silicon. The single isolation structure 202 may serve as an etch end-point provider during the etching process of the TSV opening. Therefore, the single isolation structure 202 may facilitate the etching process of the TSV opening by using another etch gas with an etch rate slower than the semiconductor substrate 200 to etch the single isolation structure 202 when the end-point (the single isolation structure 202) is detected. Further, the gate structure 204 is formed directly on the single isolation structure 202, the gate structure 204 formed of poly or metal materials has a high etch selectively to the single isolation structure 202 formed of oxide. Therefore, the etching process of the TSV opening can easily stop at the gate structure 204. Also, a smooth bottom of the TSV opening can be obtained to facilitate a conformal liner 207 and a barrier seed layer 209 to be deposited thereon to prevent the Cu out diffusion problem of the conventional TSV interconnect. In this embodiment, the resulting TSV interconnect 212 formed through the single isolation structure 202 may be embedded in a portion of the gate structure 204.

Figure 3:
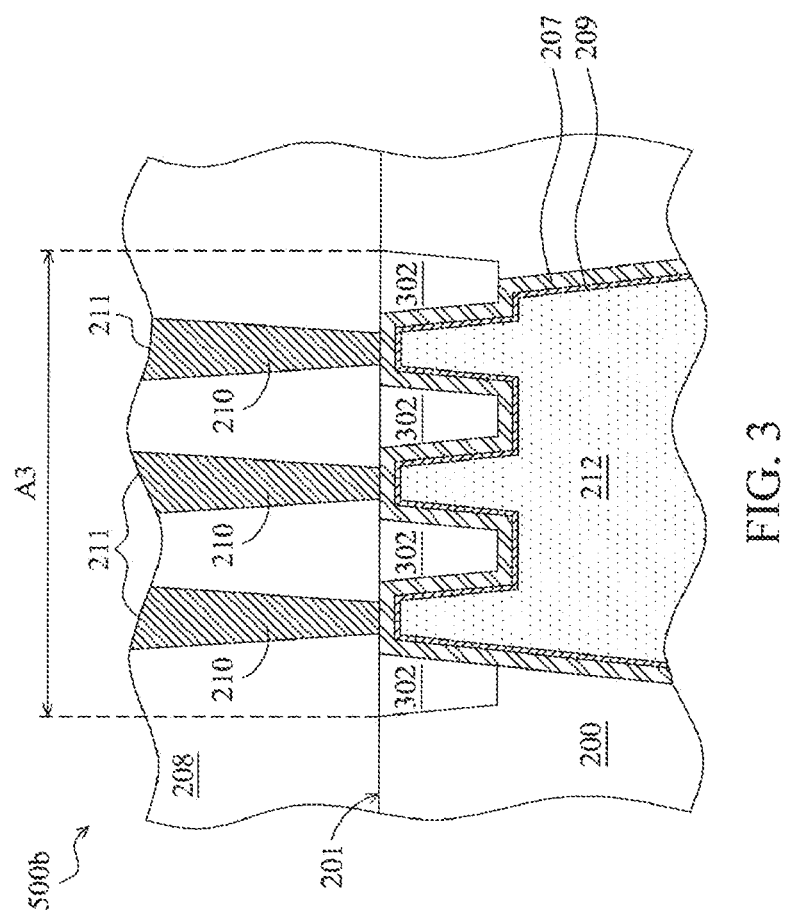
FIG. 3 is an enlarged view of another exemplary embodiment of an etch-stop structure for a semiconductor package with a through silicon via (TSV) interconnect of the invention as shown in FIG. 1.

FIG. 3 is an enlarged view of another exemplary embodiment of an etch-stop structure 500 for a semiconductor package 600 with a through silicon via (TSV) interconnect of the invention as shown in FIG. 1. In this embodiment, an etch-stop structure as shown in FIG. 3 is labeled as the etch-stop structure 500b. As shown in FIG. 3, the etch-stop structure 500b is disposed underlying the contact array 211 comprising a plurality of contacts 210 disposed on the front side 201 of the semiconductor substrate 200. In this embodiment, the contact array 211 is formed landing on the front side 201 of the semiconductor substrate 200. Therefore, bottoms of the contacts 210 align to the front side 201 of the semiconductor substrate 200. As shown in FIG. 3, the etch-stop structure 500b may comprise a plurality of isolation structures 302, such as STI features, disposed in the semiconductor substrate 200, underlying the contact array 211. In one embodiment, the isolation structures 302 may be formed with the STI features 205 as shown in FIG. 1 simultaneously. In this embodiment, the isolation structures 302 and the contacts 210 are alternatively disposed, when viewed from a top view (not shown). That is to say, the isolation structure 302 is located between two contacts 210 from a top view. The isolation structures 302 beneath the contacts 210 are designed to avert overlapping with the contacts 210 to ensure that the resulting TSV interconnect is electrically connected to the contacts 210.

In this embodiment as shown in FIG. 3, the TSV interconnect 212 is underlying the contact array 211, overlapping with the contact array 211 and the isolation structures 302. A boundary A3 of the isolation structures 302 is designed to surround the TSV interconnect 212 and the contact array 211. During the etching process of the TSV opening of the TSV interconnect 212 directly underlying the contact array 211, the isolation structures 302 formed of oxide have a high etch selectively to the semiconductor substrate 200, which is formed of a semiconductor material such as silicon. The isolation structures 302 may serve as an etch end-point provider during the etching process of the TSV opening. Therefore, the isolation structures 302 may facilitate the etching process of the TSV opening by using another etch gas with an etch rate slower than the original etch rate to etch a portion of the semiconductor substrate 200, which is close to the isolation structures 302, when the end-point (the isolation structures 302) is detected. Further, the etching process of the TSV opening can easily stop at the front side 201 of the semiconductor substrate 200. Also, a smooth bottom of the TSV opening can be obtained to facilitate a conformal liner 207 and a barrier seed layer 209 to be deposited thereon to prevent the Cu out diffusion problem of the conventional TSV interconnect. In this embodiment, a bottom of the resulting TSV interconnect 212 may align to the front side 201 of the semiconductor substrate 200.

Figure 4:
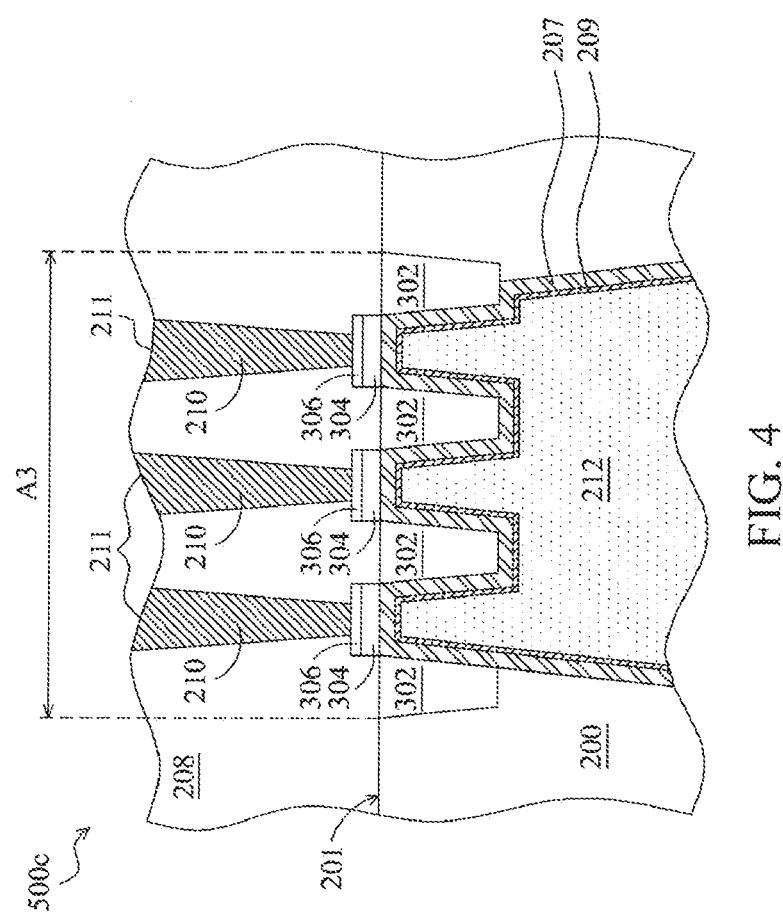
FIG. 4 is an enlarged view of yet another exemplary embodiment of an etch-stop structure for a semiconductor package with a through silicon via (TSV) interconnect of the invention as shown in FIG. 1.

FIG. 4 is an enlarged view of yet another exemplary embodiment of an etch-stop structure 500 for a semiconductor package 600 with a through silicon via (TSV) interconnect of the invention as shown in FIG. 1. In this embodiment, an etch-stop structure as shown in FIG. 4 is labeled as the etch-stop structure 500c. As shown in FIG. 4, the etch-stop structure 500c is disposed underlying the contact array 211 comprising a plurality of contacts 210 disposed on the front side 201 of the semiconductor substrate 200. In this embodiment as shown in FIG. 4, the TSV interconnect 212 is directly underlying the contact array 211. In this embodiment as shown in FIG. 4, the etch-stop structure 500c may comprise the plurality of isolation structures 302, such as STI features, disposed in the semiconductor substrate 200, underlying the contact array 211. In one embodiment, the isolation structures 302 may be formed with the STI features 205 as shown in FIG. 1 simultaneously. A boundary A3 of the isolation structures 302 is designed to surround the TSV interconnect 212 and the contact array 211. In this embodiment, the isolation structures 302 and the contacts 210 are alternatively disposed, when viewed from a top view (not shown). That is to say, the isolation structure 302 is located between two contacts 210 from a top view. The isolation structures 302 beneath the contacts 210 are designed to avert overlapping with the contacts 210 to ensure that the resulting TSV interconnect is electrically connected to the contacts 210.

Also, in this embodiment as shown in FIG. 4, a plurality of gate structures 304 is disposed on the front side 201 of the semiconductor substrate 200, vertically between the contact array 211 and the TSV interconnect 212 is a cross section view as shown in FIG. 4. Also, the gate structures 304 are designed to avert overlapping with the gate structures. Therefore, the gate structures 304 are disposed laterally between the isolation structures 302 is a cross section view as shown in FIG. 4. In one embodiment, the gate structures 304 may be formed with a gate structure of the integrated circuit device 220 as shown in FIG. 1 simultaneously. In one embodiment, the gate structures 304 are formed of poly materials or high dielectric constant (k>10) metal materials A plurality of salicide layers 306 is formed on the gate structure 304. The contacts 210 of the contact array 211 respectively land on and contacts to the salicide layers 306.

During the etching process of the TSV opening of the TSV interconnect 212 directly underlying the contact array 211 overlapping with the contact array 211 and the isolation structures 302. The isolation structures 302 formed of oxide has a high etch selectively to the semiconductor substrate 200, which is formed of a semiconductor material such as silicon. The isolation structures 302 may serve as an etch end-point provider during the etching process of the TSV opening. Therefore, the isolation structures 302 may facilitate the etching process of the TSV opening by using another etch gas with an etch rate slower than the original etch rate to etch a portion of the semiconductor substrate 200, which is close to the isolation structures 302, when the end-point (the isolation structures 302) is detected. Also, the etching process of the TSV opening can be performed without damaging the isolation structures 302.

Further, the gate structures 304 are formed directly under the contacts 210, the gate structure 204 formed of poly or metal materials has a high etch selectively to the semiconductor substrate 200, which is formed of a semiconductor material such as silicon. Therefore, the etching process of the TSV opening can easily stop at the gate structures 304, which is formed on the front side 201 of the semiconductor substrate 200, and the resulting TSV interconnect 212 may contact to the gate structures 304 to electrically connect to the contact array 211. In this embodiment, a bottom of the resulting TSV interconnect 212 may align to the front side 201 of the semiconductor substrate 200. Also, a smooth bottom of the TSV opening can be obtained to facilitate a conformal liner 207 and a barrier seed layer 209 to be deposited thereon to prevent the Cu out diffusion problem of the conventional TSV interconnect. Alternatively, the resulting TSV interconnect 212 may be embedded in a portion of the gate structures 304.

Embodiments provide an etch-stop structure for a semiconductor package with a through silicon via (TSV) interconnect. In one embodiment, the etch-stop structure may provide an additional single isolation structure/multiple isolation structures vertically between the contact array and the TSV interconnect to improve the "etch-stop" capability. The etch-stop structure is formed of materials other than the contacts of the interconnect structure and the semiconductor substrate. The isolation structure may serve as an etch end-point provider during the etching process of the TSV opening. Therefore, the isolation structure may facilitate the etching process of the TSV opening by using another etch gas with an etch rate slower than the original etch rate to etch the semiconductor substrate close to the isolation structures when the end-point (the isolation structure) is detected. Also, the etching process of the TSV opening can be performed without damaging the isolation structure. Alternatively, the etch-stop structure may comprise an additional gate structure directly under the contact. The gate structure formed of poly or metal materials has a high etch selectively to the semiconductor substrate, which is formed of a semiconductor material such as silicon. Therefore, the etching process of the TSV opening can easily stop at the gate structure, which is formed on the front side of the semiconductor substrate, and the resulting TSV interconnect may contact to the gate structures 304 to electrically connect to the contact array. Also, a smooth bottom of the TSV opening can be obtained to facilitate a conformal liner and a barrier seed layer to be deposited thereon to prevent the Cu out diffusion problem of the conventional TSV interconnect. Moreover, the etch-stop structure can be applied to a memory and logic fabricated by the via last TSV technology.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package with a through silicon via (TSV) interconnect, comprising:
   a semiconductor substrate, having a front side and a back side;
   a contact array, disposed on the front side of the semiconductor substrate;
   a plurality of isolation structures comprising shallow trench isolation (STI) features, disposed in the semiconductor substrate, underlying the contact array; and
   a TSV interconnect, through the semiconductor substrate, overlapping with the contact array and the isolation structures, wherein the contact array comprises contacts, the isolation structures avert overlapping with the contacts, and isolation structures and the contacts are alternatively disposed, and each of the contacts is located between the isolation structures, wherein bottoms of the contacts lie on the front side of the semiconductor substrate.

2. The semiconductor package with TSV interconnects as claimed in claim 1, wherein the TSV interconnect contacts to the contacts.

3. The semiconductor package with TSV interconnects as claimed in claim 1, further comprising:
   connecting structures disposed on the front side of the semiconductor substrate, respectively overlapping with the contacts; and
   salicide layers respectively formed on the connecting structures, wherein the contacts respectively contact to the salicide layers.

4. The semiconductor package with TSV interconnects as claimed in claim 3, wherein the TSV interconnect contacts to the connecting structures.

5. The semiconductor package with TSV interconnects as claimed in claim 3, wherein the isolation structures avert overlapping with the connecting structures.

6. The semiconductor package with TSV interconnects as claimed in claim 1, wherein a boundary of the isolation structures surrounds the contact array and the TSV interconnect.

* * * * *